(12) United States Patent
Wang

(10) Patent No.: US 9,159,668 B2
(45) Date of Patent: Oct. 13, 2015

(54) E-FUSE CIRCUIT AND METHOD FOR PROGRAMMING THE SAME

(71) Applicant: United Microelectronics Corp., Hsinchu (TW)

(72) Inventor: Min-Chia Wang, New Taipei (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 95 days.

(21) Appl. No.: 14/154,679

(22) Filed: Jan. 14, 2014

(65) Prior Publication Data

US 2015/0200161 A1   Jul. 16, 2015

(51) Int. Cl.
*H01H 85/00* (2006.01)
*H01L 23/525* (2006.01)
*H01L 21/66* (2006.01)

(52) U.S. Cl.
CPC ............ *H01L 23/5256* (2013.01); *H01L 22/14* (2013.01); *H01L 22/20* (2013.01)

(58) Field of Classification Search
CPC .. H01L 22/20; H01L 23/5252; H01L 23/5256
USPC ......................................................... 327/525
See application file for complete search history.

(56) References Cited

U.S. PATENT DOCUMENTS

| | | | |
|---|---|---|---|
| 6,703,885 B1 * | 3/2004 | Fan et al. ...................... | 327/308 |
| 8,471,623 B2 | 6/2013 | Xiong et al. | |
| 2006/0181330 A1 * | 8/2006 | Dixon et al. .................. | 327/525 |
| 2010/0014373 A1 * | 1/2010 | Anand et al. ................ | 365/225.7 |
| 2010/0277999 A1 * | 11/2010 | Do .............................. | 365/210.1 |
| 2011/0012668 A1 * | 1/2011 | Rosik et al. .................. | 327/525 |

* cited by examiner

*Primary Examiner* — William Hernandez
(74) *Attorney, Agent, or Firm* — WPAT, PC; Justin King

(57) ABSTRACT

An electronic-fuse (e-fuse) circuit includes: an e-fuse array; a control switch, coupled to the e-fuse array, for controlling whether a voltage supply is applied to the e-fuse array in programming; and a close loop feedback circuit, coupled to the control switch and the e-fuse array, for clamping at lease one node voltage of the e-fuse array to a reference voltage, and for controlling the control switch to control a blowing current in programming the e-fuse array.

12 Claims, 6 Drawing Sheets

100

E-FUSE CIRCUIT AND METHOD FOR PROGRAMMING THE SAME

BACKGROUND

1. Technical Field

The disclosure relates to an e-fuse (electronic fuse) circuit, and a method for programming the same.

2. Description of the Related Art

Integrated circuits typically include an e-fuse circuit which is capable of being programmed to change an internal setting without changing a design. The e-fuse circuit is used to address a problem that the integrated circuit may not normally operate due to the deviation or defect of the process. By the e-fuse circuit, the deviation of the process is repaired or a defective circuit is replaced, thereby improving the yield of the integrated circuit.

Electrical connection characteristics of the e-fuse used in the e-fuse circuit are changed when a laser beam or an electrical stress is applied to the fuse. E-fuses programmed using electrical stress (an electrical way) are divided into an antitype fuse in which electrical connection state is changed from an open state to a short state, and a blowing type fuse in which an electrical connection state is changed from a short state to an open state.

There needs an e-fuse circuit which enhances yield, avoids device (for example, a core device used in the e-fuse circuit) reliability issue, and provides wide voltage supply operating range.

SUMMARY

Embodiments of the disclosure provide an e-fuse circuit and a method for programming the same. The embodiment of the disclose enhances yield, avoids device reliability issue, and provides wide voltage supply operating range by a close loop feedback control.

According to one embodiment, provided is an electronic-fuse (e-fuse) circuit. The e-fuse circuit includes: an e-fuse array; a control switch, coupled to the e-fuse array, for controlling whether a voltage supply is applied to the e-fuse array in programming; and a close loop feedback circuit, coupled to the control switch and the e-fuse array, for clamping at lease one node voltage of the e-fuse array to a reference voltage, and for controlling the control switch to control a blowing current in programming the e-fuse array.

According to one embodiment, provided is a method for programming an e-fuse circuit, including: applying a voltage supply to the e-fuse circuit; turning on at least one blowing device of an e-fuse array of the e-fuse circuit; and clamping and detecting at lease one node voltage of the e-fuse array to a reference voltage to control a blowing current from the voltage supply in programming the e-fuse array.

DETAILED DESCRIPTION

Figure 1:
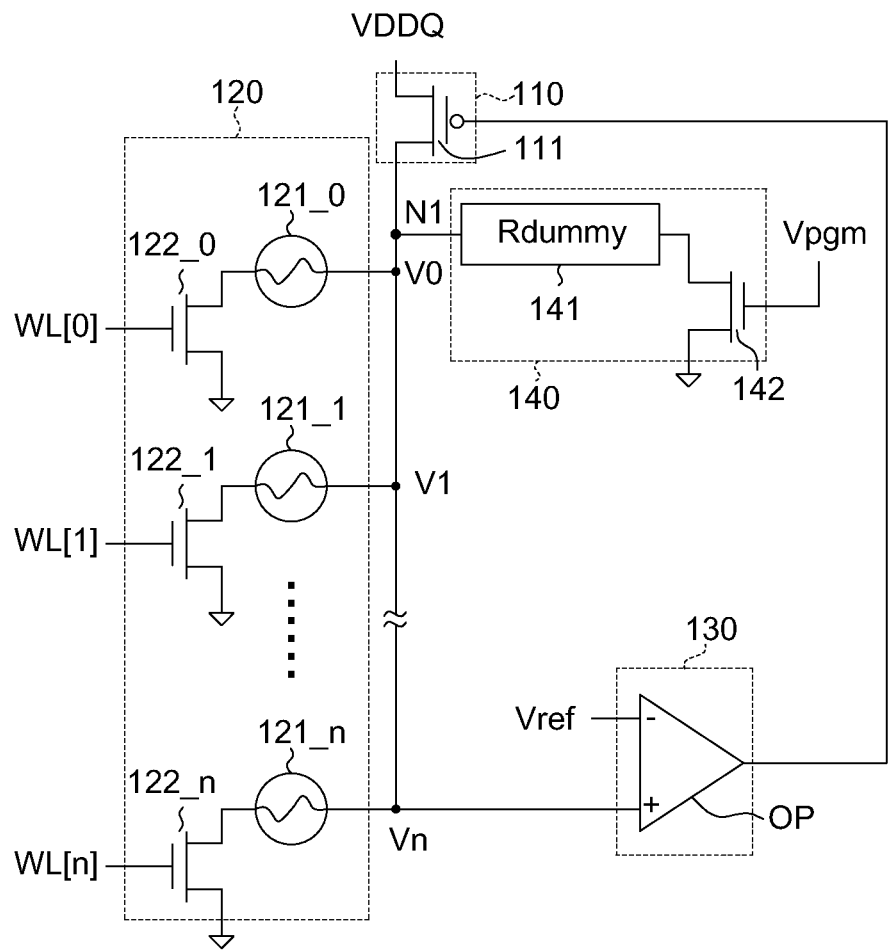
FIG. 1 shows a circuit diagram of an e-fuse circuit according to an embodiment of the disclosure.

FIG. 1 shows a circuit diagram of an e-fuse circuit according to an embodiment of the disclosure. As shown in FIG. 1, the e-fuse circuit 100 according to the embodiment of the disclosure includes a control switch 110, an e-fuse array 120, a close loop feedback circuit 130 and a leakage path 140.

The control switch 110 is coupled to a voltage supply VDDQ. Further, the control switch 110 is controlled by the close loop feedback circuit 130. The control switch 110 controls whether the voltage supply VDDQ is applied to the e-fuse array 120 in programming.

The control switch 110 includes a MOS switch 111 (for example, but not limited by, a PMOS transistor). The MOS switch 111 includes a first terminal (for example a source terminal) coupled to the voltage supply VDDQ, a control terminal (for example, a gate terminal) coupled to the close loop feedback circuit 130 and a second terminal (for example a drain terminal) coupled to the e-fuse array 120.

The e-fuse array 120 includes a plurality of e-fuse cells 121_0~121_$n$ (n being a natural number) and a plurality of blowing devices (for example, MOS transistors) 122_1~122_$n$. The e-fuse cells 121_0~121_$n$ are coupled to the blowing devices 122_1~122_$n$. Each of the blowing devices 122_1~122_$n$ includes a first terminal (for example a source terminal) coupled to ground (GND), a control terminal (for example a gate terminal) coupled to a corresponding one of word lines WL[0]~WL[n], and a second terminal (for example a drain terminal) coupled to a corresponding one of the e-fuse cells 121_0~121_$n$.

If the word line is selected, then the corresponding e-fuse cell is selected to be programmed. For example, if the word line WL[0] is selected, then the blowing device 122_0 is turned on and then the e-fuse cell 121_0 is under programming.

The close loop feedback circuit 130 is for clamping the internal node voltages of the e-fuse circuit 100 to be close to a reference voltage Vref in programming. For example, if the e-fuse cell 121_0 is under programming, the control switch 110 is turned on and the voltage supply VDDQ is applied to the e-fuse cell 121_0 and the blowing device 122_0. Therefore, a blow current will flow into the e-fuse cell 121_0. By the close loop feedback from the close loop feedback circuit 130, the node voltages V0~Vn will be clamped at/near the reference voltage Vref. Thus, the turned-ON blowing device (s) (i.e. the blowing device 122_0) will be not damaged by a high voltage (i.e. the voltage supply VDDQ) because the node voltage V0 is clamped at/near the reference voltage Vref. The blowing device may be core device which has lower bearable voltage than the control switch 110 (which is an IO device) and thus in the embodiment, the node voltages have to be clamped to protect the blowing devices.

On the contrary, if without the clamping of the close loop feedback circuit 130, then the e-fuse cells may be damaged by the voltage supply VDDQ in programming or at the transient moment the control switch 110 is turned ON.

By the close loop feedback control, if the node voltage Vn is higher than the reference voltage Vref, then the close loop feedback circuit 130 outputs a control signal (for example a high logic signal) to the control switch 110 to turn OFF the control switch 110. Then, the node voltage Vn will be lowered due to the internal discharge path inside the close loop feedback circuit 130 and/or the leakage path 140. Or, if the node voltage Vn is lower than the reference voltage Vref, then the close loop feedback circuit 130 outputs a control signal (for example a low logic signal) to the control switch 110 to turn ON the control switch 110. Then, the node voltage Vn will be pulled high to the reference voltage because the voltage supply VDDQ is applied via the turned-on control switch 110.

The close loop feedback circuit 130 includes an operation amplifier OP. The operation amplifier OP has two input terminals coupled to the feedback point (i.e. the node voltage Vn, which is farthest from the voltage supply VDDQ) and the reference voltage Vref, respectively, and an output terminal couple to the control switch 110.

In the embodiment, the reason why the feedback point is at a farthest point from the voltage supply VDDQ is to make sure that each the blowing current flowing into each the blowing devices is enough. In other words, if the feedback point is set at the node voltage V1 (which is not a farthest point from the voltage supply VDDQ), then the node voltage Vn is Vn=Vref−I*R (I referring to the current flowing on the routing line 150 and R referring to the resistance of the routing line 150) and the blowing current (which is related to the node voltage Vn=Vref−I*R) flowing through the e-fuse cell 121_$n$ may be not high enough. Thus, in the embodiment, the feedback point is set at a farthest point from the voltage supply VDDQ for providing enough blowing current to each the blowing devices.

The leakage path 140 provides a leakage path for the current flowing on the routing line 150. That is to say, in the embodiment, the current from the control switch 110 will include two sub-currents, one sub-current (or said, the blowing current) flowing into the e-fuse array 120 and the other sub-current (or said, additional current) flowing into the leakage path 140. Because the addition current is discharged to ground by the leakage path 140, there is substantially no current flowing on the routing line 150 under programming. For example, if the e-fuse cell 121_0 is to be programmed, then the blowing current will flow into the e-fuse cell 121_0 to program the e-fuse cell 121_0 and the additional current will be discharged to ground via the leakage path 140. Therefore, no additional current flows on the routing line 150, and thus V1≈V2≈...Vn≈Vref (because there is no voltage drop on the routing line 150 from the node V0 to the node Vn).

The leakage path 140 (which may be optional in the embodiment) includes a dummy impedance 141 (for example, a dummy resistor) and a MOS transistor 142. Because of the dummy resistor 141, the current flowing through the leakage path 140 will be small. Thus, the power consumption will be not increased too much. Alternatively, if the MOS transistor 142 would provide enough ON resistance, then the dummy resistor 141 would be omitted. In the following, the MOS transistor 142 may be referred as a leakage switch.

The MOS transistor 142 has a first terminal (for example, a source terminal) coupled to ground, a control terminal (for example, a gate terminal) coupled to the dummy resistor 141, and a second terminal (for example, a drain terminal) coupled to a programming control signal Vpgm. The programming control signal Vpgm is synchronous with the voltage supply VDDQ. The programming control signal Vpgm may have lower voltage level than the voltage supply VDDQ. Waveforms of the programming control signal Vpgm and the voltage supply VDDQ are shown in FIG. 2.

When the programming control signal Vpgm is asserted, the MOS transistor 142 is turned ON to discharge the additional sub-current on the routing line 150 to ground.

Figure 2:
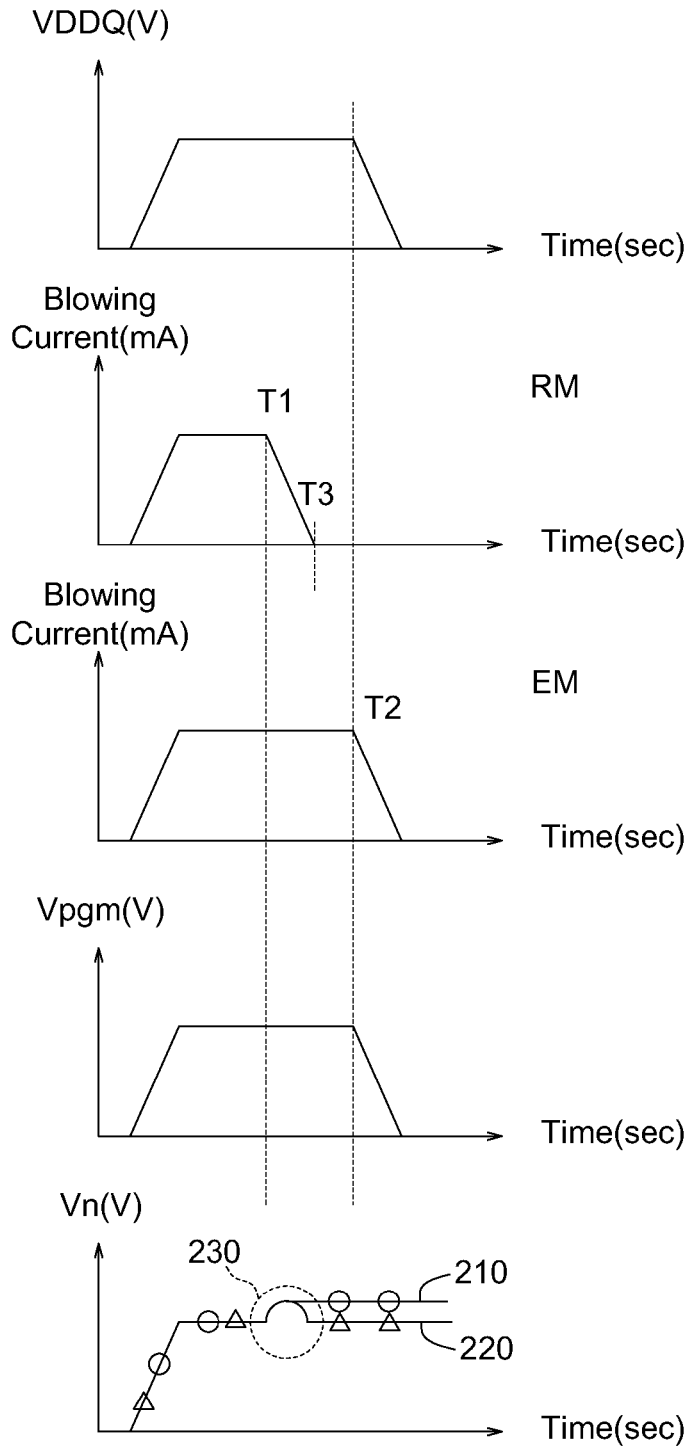
FIG. 2 shows waveforms of the e-fuse circuit according to the embodiment of the disclosure.

FIG. 2 shows waveforms of the e-fuse circuit 100. The voltage Vn has two different waveforms 210 and 220 (the waveform 210 is marked by the reference symbol "○" and the waveform 220 is marked by the reference symbol "Δ"). The waveform 210 refers to the node voltage Vn in the case that the e-fuse circuit 100 does not include the leakage path 140; while the waveform 220 refers to the node voltage Vn in the case that the e-fuse circuit 100 includes the leakage path 140.

FIG. 2 also shows the blowing current waveforms in two modes, EM (Electron Migration) mode and RM (Rupture) mode. Whether the e-fuse cell is under EM mode or RM mode is determined by the characteristic of the e-fuse cell itself. That is to say, even if the e-fuse cells 121_0~121_$n$ are concurrently manufactured, the characteristics of the e-fuse cells 121_0~121_$n$ may be different from each other. After the e-fuse cell is applied by the blowing current, if the e-fuse cell is blown at the timing T1 (i.e. this e-fuse cell is blown before the programming is completed), the e-fuse cell is regarded as being under the RM mode. On the contrary, after the e-fuse cell is applied by the blowing current, if the e-fuse cell is blown at the timing T2 (i.e. this e-fuse cell is blown at the same the programming is completed), the e-fuse cell is regarded as being under the EM mode. If the e-fuse cell is under the RM mode, then after the timing T3, there is almost no current on the routing line 150 and thus the node voltage Vn will be transiently pulled high by the voltage supply VDDQ (as shown by the reference symbol 230). If the e-fuse circuit 100 is not protected by the close loop feedback circuit 130, then the pulled-up node voltage would damage the blowing devices. However, in the embodiment, by the protection from the close loop feedback circuit 130, the node voltage may be clamped at/near the reference voltage Vref and thus the blowing devices will not be damaged by the node voltage and/or the voltage supply VDDQ.

Further, after the node voltage Vn is transiently pulled high by the voltage supply VDDQ (as shown by the reference symbol 230), if the e-fuse circuit 100 includes the leakage path 140, then the leakage path 140 will discharge the additional current flowing on the routing line 150 and thus the node voltage Vn is lowered as shown by the waveform 220. On the contrary, if the e-fuse circuit 100 does not include the leakage path 140, the additional current on the routing line 150 may keep the node voltage Vn, as shown by the waveform 210. However, no matter the e-fuse circuit 100 includes the leakage path 140 or not, the node voltage Vn will not be too high to damage the blowing devices.

Figure 3:
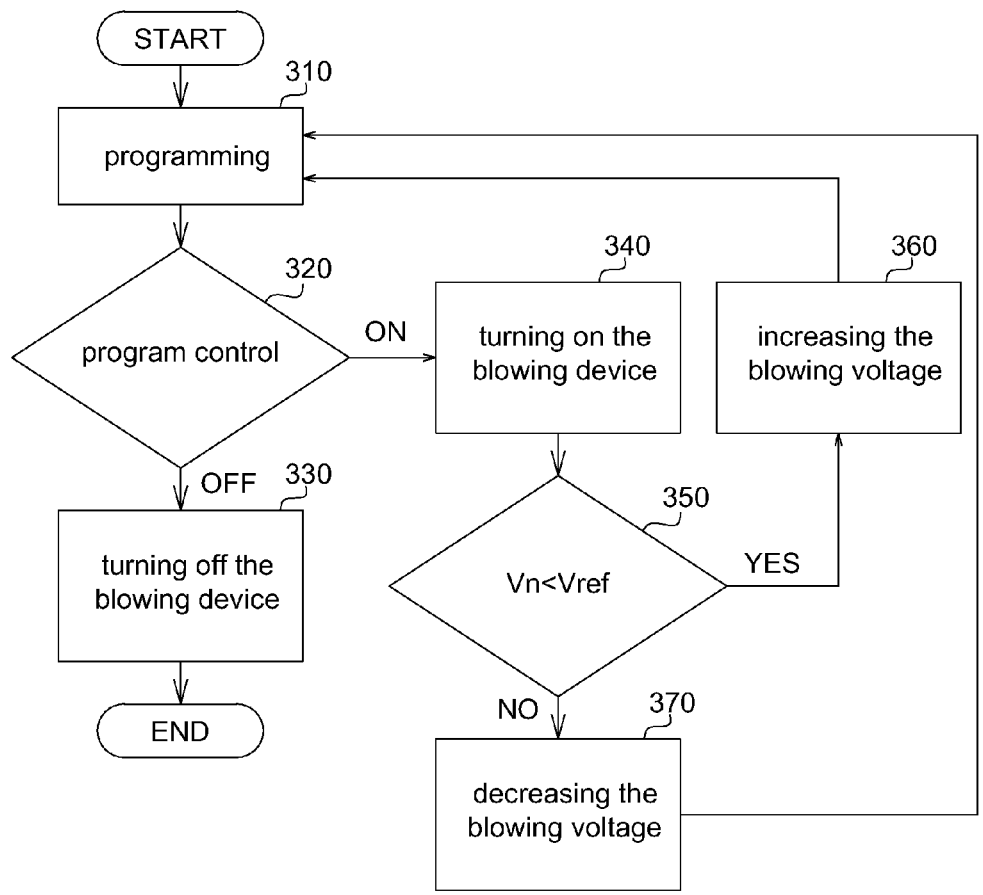
FIG. 3 shows a method for programming the e-fuse circuit according to the embodiment of the disclosure.

Now referring to FIG. 3, a method for programming the e-fuse circuit 100 according to the embodiment of the disclosure is shown. In step 310, the e-fuse circuit 100 is programmed. For example, the voltage supply VDDQ and/or the programming control signal Vpgm are both asserted to program the e-fuse array 120.

At step 320, it is determined whether the programming control is on or not. For example, it is determined whether the voltage supply VDDQ and/or the programming control signal Vpgm are still asserted or not. If the voltage supply VDDQ and/or the programming control signal Vpgm are still asserted, then the program control is still on; and on the contrary, if the voltage supply VDDQ and/or the programming control signal Vpgm are deasserted, then the program control is off. If the program control is off, then the blowing device is turned from on to off to end the programming operation, as shown in step 330. If the program control is on, then the blowing device is turned on for programming the selected e-fuse cell, as shown in step 340.

In step 350, the close loop feedback circuit 130 compares the node voltage Vn with the reference voltage Vref. If the node voltage Vn is lower than the reference voltage Vref, then the blowing voltage is increased, as shown in step 360. For example, If the node voltage Vn is lower than the reference voltage Vref, then the close loop feedback circuit 130 outputs a comparison result to the control switch 110 to turn on the control switch 110 and thus the voltage supply VDDQ is allowed to be applied on the selected e-fuse cell and thus the blowing voltage (i.e. the node voltage at the selected e-fuse cell) is increased.

If the node voltage Vn is higher than the reference voltage Vref, then the blowing voltage is decreased, as shown in step 370. For example, If the node voltage Vn is higher than the reference voltage Vref, then the close loop feedback circuit 130 outputs a comparison result to the control switch 110 to turn off the control switch 110 and thus the voltage supply VDDQ is not able to be applied on the selected e-fuse cell and thus the blowing voltage (i.e. the node voltage at the selected e-fuse cell) is decreased (because of the internal discharge path inside the close loop feedback circuit 130 and because of the discharge path of the leakage path 140). Flow in FIG. 3 is performed until the program control is ended.

Figure 4:
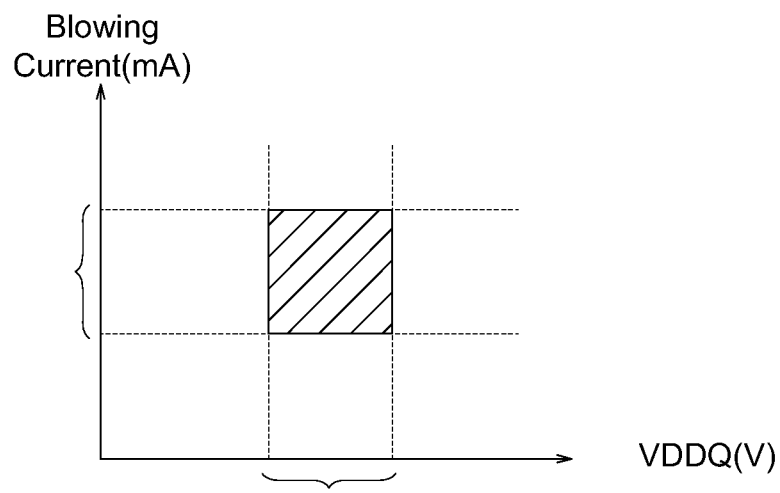
FIG. 4 shows the current margin window and the voltage margin window according to the embodiment of the disclosure.

FIG. 4 shows the blowing current margin window and the voltage supply margin window according to the embodiment of the disclosure. In the embodiment of the disclosure, the blowing current margin window will be reduced (compared with the prior art). This is because the node voltages V0~Vn are clamped at/near the reference voltage Vref by the close loop feedback circuit 130 and the blowing current variation will be small. The blowing current is related to the node voltage and if the node voltage is clamped, the blowing current will almost fixed.

Further, in the embodiment of the disclosure, the voltage margin window will be larger (compared with the prior art). This is also because the node voltages V0~Vn are clamped by the close loop feedback circuit 130 to the reference voltage Vref. Even if the voltage supply VDDQ has a little variation, this voltage supply variation would not negatively affect the node voltages which are clamped.

Figure 5:
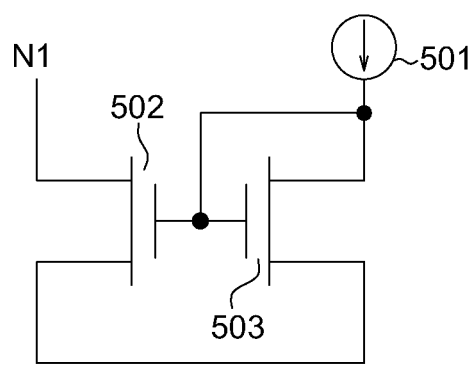
FIG. 5 shows another possible implementation for the leakage path according to another embodiment of the disclosure.

Although in FIG. 1, the leakage path 140 is implemented by the dummy resistor 141 and the MOS transistor 142, the disclosure is not limited by this. FIG. 5 shows another possible implementation for the leakage path according to another embodiment of the disclosure. As shown in FIG. 5, the leakage path 140' is implemented by, for example, but not limited to, a current sink. The leakage path 140' of FIG. 5 includes a constant current source 501 and two transistors 502 and 503. The constant current source 501 is coupled to the transistors 502 and 503 which form a current mirror. In details, the constant current source 501 is coupled to the gate of the transistor 502 and to the drain and the gate of the transistor 503. The transistor 502 has: a drain coupled to the node N1 in the e-fuse circuit 100 of FIG. 1; a gate coupled to the gate of the transistor 503 and to the constant current source 501; and a source coupled to ground. The transistor 503 has: a drain coupled to the constant current source 501; a gate coupled to the gate of the transistor 502 and to the constant current source 501; and a source coupled to ground.

Because the transistors 502 and 503 form a current mirror, the current flowing through the transistors 502 and 503 will be the same. Thus, if there is additional blowing current on the routing line, then this additional blowing current will be drawn to ground via the node N1 and the transistor 502. In other words, this additional blowing current will be drained to ground by the current sink of FIG. 5.

Figure 6A:
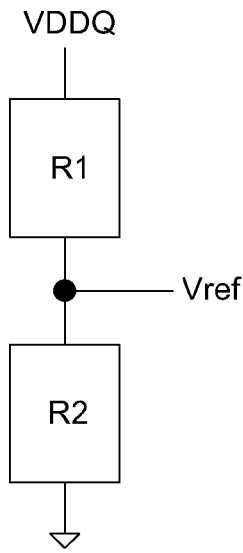
FIG. 6A~6C show several possible implementation for generating the reference voltage Vref.
Figure 6B:
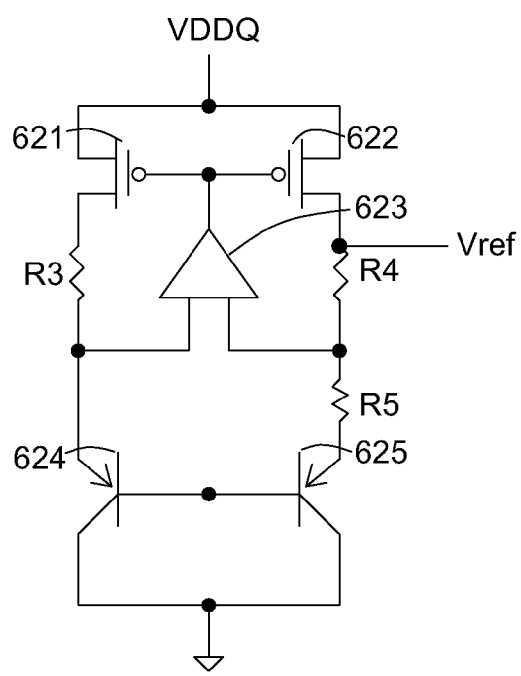
Figure 6C:
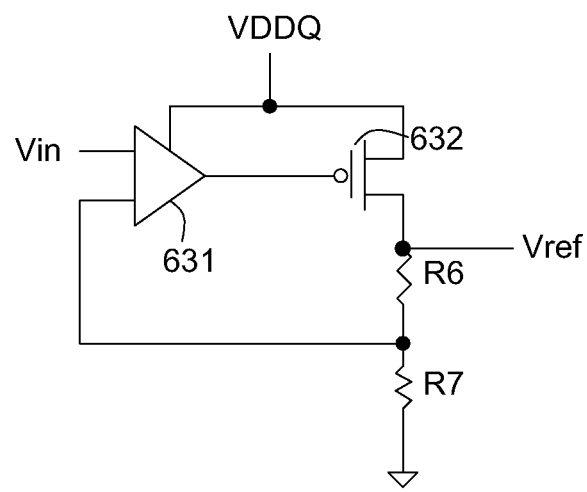

Now, how to generate the reference voltage Vref is described. FIG. 6A~6C show several possible implementation for generating the reference voltage Vref. As shown in FIG. 6A, the reference voltage Vref is generated by a voltage divider which includes series connected resistors R1 and R2. Thus, Vref=VDDQ*R2/(R1+R2).

As shown in FIG. 6B, the reference voltage Vref is generated by a voltage bandgap circuit which includes MOS transistors 621~622 (which form a current mirror), an operation amplifier 623, BJT transistors 624~625 and resistors R3~R5. The MOS transistors 621~622 have: gates coupled to each other and to the operation amplifier 623; sources coupled to the voltage supply VDDQ; and drains coupled to the resistors R3 and R4, respectively. The current mirror mirrors the currents flowing through the resistors R3~R5. The resistors R3~R5 convert the current into voltages. Thus, in FIG. 6B, Vref=VBE+I*(R4+R5), wherein VBE refers to the base-emitter voltage of the BJT transistor 625. Details of operations of the voltage bandgap circuit are omitted here.

If the reference voltage Vref is generated by the voltage bandgap circuit of FIG. 6B, the blow current will not impact by temperature, process and voltage variation.

As shown in FIG. 6C, the reference voltage Vref is generated by a voltage regulator which includes an operation amplifier 631, a MOS transistor 632 and series-connected resistors R6~R7. The operation amplifier 631 has input terminals coupled to an input voltage Vin and the resistor R7, and an output terminal coupled to the MOS transistor 632. The MOS transistor 632 has a source coupled to the voltage supply VDDQ, a gate coupled to the operation amplifier 631 and a drain coupled to the resistor R6. By the feedback of the operation amplifier 631, the output voltage (i.e. the reference voltage Vref) is expressed by: Vref=Vin*(R6+R7)/R7. Details of operations of the voltage regulator of FIG. 6C are omitted here.

As described above, in the embodiment of the disclosure, the blowing current applying into the e-fuse array is adaptive because the close loop feedback circuit is used for clamping the node voltages of the e-fuse array. Still further, because the node voltages are clamped, the blowing currents flowing into the e-fuse cells will have small variation.

Still further, in the embodiment of the disclosure, in order to suppress the voltage variation at the node voltage, the leakage path is further used to draw the additional blowing current from the voltage supply.

Still further, in the embodiment of the disclosure, even if the voltage supply has a variation, this variation will not effect the blowing current (because the node voltages are clamped) and thus the e-fuse circuit can stand higher voltage supply variation than the prior art. Besides, because the blowing current variation is suppressed and the e-fuse circuit can stand a higher voltage supply variation, the yield is improved.

Still further, in the embodiment of the disclosure, because the node voltages are clamped, in programming, the blowing devices of the e-fuse array will not face the high voltage supply and thus the device reliability of the blowing device is improved.

Still further, in the embodiment of the disclosure, in programming, the voltage drop issue on the routing line is also addressed because the leakage path draws additional (i.e. unnecessary) blowing current from the control switch. On the contrary, in the prior art, because of the voltage drop issue on the routing line, the node voltages of the e-fuse array will be different and thus the blowing current will have large variation.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic-fuse (e-fuse) circuit, comprising:
   an e-fuse array;
   a control switch, coupled to the e-fuse array, for controlling whether a voltage supply is applied to the e-fuse array in programming;
   a close loop feedback circuit, coupled to the control switch and the e-fuse array, for clamping at least one node voltage of the e-fuse array to a reference voltage, and for controlling the control switch to control a blowing current in programming the e-fuse array; and
   a leakage path, coupled to the control switch, for discharging an additional current from the control switch.

2. The e-fuse circuit according to claim 1, wherein the leakage path includes:
   a dummy impedance, coupled to the control switch; and
   a leakage switch, coupled to the dummy impedance, controlled by a programming control signal to discharge the additional current to GND.

3. The e-fuse circuit according to claim 2, wherein the programming control signal is synchronous with the voltage supply.

4. The e-fuse circuit according to claim 1, wherein the leakage path includes a current sink.

5. The e-fuse circuit according to claim 1, wherein the reference voltage is generated by a voltage divider.

6. The e-fuse circuit according to claim 1, wherein the reference voltage is generated by a voltage bandgap circuit.

7. The e-fuse circuit according to claim 1, wherein the reference voltage is generated by a voltage regulator.

8. The e-fuse circuit according to claim 1, wherein the close loop feedback circuit clamps the node voltage of the e-fuse array, which is farthest away from the voltage supply, to the reference voltage.

9. A method for programming an e-fuse circuit, including:
   applying a voltage supply to the e-fuse circuit;
   turning on at least one blowing device of an e-fuse array of the e-fuse circuit;
   detecting and clamping at least one node voltage of the e-fuse array to a reference voltage to control a blowing current from the voltage supply in programming the e-fuse array; and
   discharging an additional current from the voltage supply by a leakage path.

10. The method according to claim 9, wherein the leakage path is controlled by a programming control signal which is synchronous with the voltage supply.

11. The method according to claim 9, wherein the detecting and clamping step includes:
    detecting and clamping the node voltage of the e-fuse array, which is farthest away from the voltage supply, to the reference voltage.

12. The method according to claim 9, wherein the detecting and clamping step includes:
    if the node voltage of the e-fuse array is higher than the reference voltage, application of the voltage supply into the e-fuse array is prohibited, and the node voltage of the e-fuse array is discharged; and
    if the node voltage of the e-fuse array is lower than the reference voltage, application of the voltage supply into the e-fuse array is allowed.

* * * * *